(12) United States Patent
White

(10) Patent No.: US 6,993,054 B2
(45) Date of Patent: Jan. 31, 2006

(54) ENHANCED LINK OPERATION OF DIRECTLY MODULATED LASERS USING GAIN-COUPLED GRATINGS

(75) Inventor: John Kenton White, Ottawa (CA)

(73) Assignee: Bookham Technology, plc, Towcester (GB)

(*) Notice: Subject to any disclaimer, the term of this patent is extended or adjusted under 35 U.S.C. 154(b) by 264 days.

(21) Appl. No.: 10/025,866

(22) Filed: Dec. 26, 2001

(65) Prior Publication Data

US 2003/0103538 A1    Jun. 5, 2003

Related U.S. Application Data

(60) Provisional application No. 60/334,013, filed on Nov. 28, 2001.

(51) Int. Cl.
*H01S 5/00*    (2006.01)

(52) U.S. Cl. .......................... 372/45; 372/43; 372/44; 372/46

(58) Field of Classification Search ............... 372/45, 372/44, 46

See application file for complete search history.

(56) References Cited

U.S. PATENT DOCUMENTS

| | | | |
|---|---|---|---|
| 6,477,194 B1 * | 11/2002 | Eng et al. ................... | 372/96 |
| 2003/0091081 A1 * | 5/2003 | Sahara et al. .............. | 372/45 |

OTHER PUBLICATIONS

Yang et al. (Enhanced Performance of Uncooled Strongly-Gain-Coupled MQW DFB Lasers in 10Gb/s Link Applications) paper presented at European Conference for Optical Communications, Fall 2001.*

Zah Chung-En et al: "High-Performance Uncooled 1.3 μm $Al_xGa_{1-x-y}As$/InP Strained-Layer Quantum-Well Lasers for Subscriber Loop Applications", IEEE Journal of Quantum Electronics, Feb. 1994, vol. 30, No. 2, pp. 511-523.

Lowery Arthur J. et al: "Performance Comparison of Gain-Coupled and Index-Coupled DFB Semiconductor Lasers", IEEE Journal of Quantum Electronics, Sep. 1994, vol. 30, No. 9, pp. 2051-2063.

Lu Hanh et al: "Dynamic Properties of Partly Gain-Coupled 1.55-μm DFB Lasers", IEEE Journal of Quantum Electronics, Aug. 1995, vol. 31, No. 8, pp. 1443-1450.

Lu Hanh et al: "Single-Mode Operation Over a Wide Temperature Range in 1.3 μm InGaAsP/InP Distributed Feedback Lasers", Journal of Lightwave Technology, May 1996, vol. 14, No. 5, pp. 851-859.

Chen Jianyao et al: "Transient Side-Mode Suppression in Gain-Coupled DFB Lasers", IEEE Journal of Quantum Electronics, Jan. 1998, vol. 34, No. 1, pp. 113-119.

Hong J. et al: "Strongly Gain-Coupled (SGC) Coolerless (−40° C.—+85° C0) MQW DFB Lasers", IEEE Journal of Selected Topics in Quantum Electronics, May/Jun. 1999, vol. 5, No. 3, pp. 442-448.

Massara A.B. et al: "Ridge waveguide InGaAsP lasers with uncooled 10Gbit/s operation at 70° C.", Electronics Letters, Sep. 16, 1999, vol. 35, No. 19, pp. 1646-1647.

(Continued)

*Primary Examiner*—Minsun Oh Harvey
*Assistant Examiner*—Dung Nguyen
(74) *Attorney, Agent, or Firm*—Lahive & Cockfield, LLP; Anthony A. Laurentano, Esq.

(57) ABSTRACT

Increasing the gain-coupling of a DFB directly modulated semiconductor laser permits the output response to be overdamped without lowering the relaxation oscillation frequency of the output. The overdamping permits the laser to operate at modulation frequencies which approach the relaxation oscillation frequency with satisfactory error performance. The performance improvement is sufficient to permit operation of the laser in an uncooled environment.

6 Claims, 4 Drawing Sheets

OTHER PUBLICATIONS

Champagne A. et al: "Global and Local Effects in Gain-Coupled Multiple-Quantum-Well DFB Lasers". IEEE Journal of Quantum Electronics, Oct. 1999, vol. 35, No. 10, pp. 1390-1401.

Springthorpe A.J. et al: "Strained 1.3 µm MQW AlGaInAs lasers grown by digital alloy MBE", Electronics Letters, Jun. 8, 2000, vol. 36, No. 12, pp. 1031-1032.

Ebberg A. et al: "10 Gbit/s transmission using directly modulated uncooled MQW ridge waveguide DFB lasers in TO package", Electronics Letters, Aug. 17, 2000, vol. 36, No. 17, pp. 1476-1477.

White J.K. et al: "85° C. Investigation of Uncooled 10-Gb/s Directly Modulated InGaAsP RWG GC-DFB Lasers", IEEE Photonics Technology Letters, Aug. 2001, vol. 13, No. 8, pp. 773-775.

Yang S. et al: "Enhanced Performance of Uncooled Strongly-Gain-Coupled MQW DFB Lasers in 10Gb/s Link Applications", paper presented at European Conference for Optical Communications, Fall 2001.

* cited by examiner

ENHANCED LINK OPERATION OF DIRECTLY MODULATED LASERS USING GAIN-COUPLED GRATINGS

RELATIONSHIP TO RELATED APPLICATIONS

This application claims the benefit of a provisional application entitled "Enhanced Performance of Uncooled Strong Gain-Coupled MQW DFB Lasers in 10 GB/S Link Applications" filed Nov. 28, 2001 in the name of the present inventor.

1. Field of the Invention

This invention relates to semi-conductor lasers and in particular to directly modulated distributed feedback lasers.

2. Background of the Invention

Directly modulated semiconductor lasers are used in optical communications applications. In such lasers, the double heterojunction semiconductor acts like a diode, in that a biasing signal applied across the junctions of the semiconductor device creates current and the migration of electrons and holes from the outer layers or non-active region of the device into the central layer or active region. The electrons and holes combine in the active regions to create photons that travel transversely along the active region.

As the photons traverse across the active region layer, they encounter mirrors at the device boundaries, which create a cavity. The cavity reflects some of the photons and causes the active region to laser. The lasing activity in a directly modulated semiconductor laser responds to the current level applied to it by the biasing signal. If the biasing current is below a minimum threshold level, few photons are emitted. Once the biasing current exceeds the threshold, the device lases and emits a stream of photons, generally in a linear relationship to the applied biasing current. Accordingly, an electrical signal of sufficient current can be used to modulate the laser output.

A particular type of directly modulated semiconductor laser is the distributed feedback (DFB) laser. DFB lasers differ from other directly modulated lasers in respect of the coupling. Typically, in a semiconductor laser, the forward field feeds into the backward field only at the mirror boundaries of the laser. DFB lasers couple the forward and backward fields throughout the length of the device.

DFB lasers achieve this coupling by means of a grating applied to the semiconductor device. The grating is a periodic pattern that is etched onto one or more planar layers of the device. The grating effectively acts as a Bragg grating that periodically changes the index of refraction of the device. As a result, the device operates as if there were a frequency selected mirror. Photons that are an integral number of wavelengths of the grating length constructively interfere at the grating boundaries and reflect. Photons that are not an integral number of wavelengths destructively interfere to varying degrees at the grating boundaries and transmit to varying degrees. At wavelengths at which there is a high degree of transmission, lasing occurs.

Every DFB laser has two characteristic transmission windows at which lasing will take place. Each of the two wavelengths is appropriate for optical data communications processing, typically lying within the range between 1270 nm and 1680 nm. However, the difference in the two wavelengths is too much for the design tolerances of the optical data communications systems. Accordingly the system has to be designed to work at one of the two wavelengths and those devices which emit at the second wavelength must be discarded.

There are generally two types of DFB lasers, namely index-coupled and gain-coupled. In index-coupled DFB lasers, the index grating is applied to the outer layers surrounding the active region. Because the boundaries between the active region and the surrounding outer layers form only a very weak waveguide and the optical cavity mode extends beyond the active region into the outer layers, lasing can still take place.

One advantage of index coupling is that the active region volume is unaffected by the index coupled grating. An index coupled grating device with the same active region design as a gain coupled device has a larger active region volume and is capable of creating more photons. The disadvantage of index coupling, however, is that the probability of achieving a laser which lases at one of the two potential wavelengths remains approximately 0.5. Thus, a large number of devices must be discarded.

In gain-coupled DFB lasers, the grating is applied to the active region itself. One of the two resulting wavelengths will tend to overlap the areas of high gain and will thus be generated with a higher gain. The other wavelength will tend to overlap the valleys of low gain and will thus be generated with a lower gain. The relative disparity in gain between the two generated wavelengths will tend to increase the likelihood that the laser will lase at the wavelength corresponding to the higher gain. Thus, the yield from a particular design will be enhanced. However, because the application of the index grating reduces the active region volume, the ability to generate photons is compromised.

Because of this performance advantage associated with them, much of the emphasis to date has been on index-coupled DFB lasers.

Whichever kind of laser is utilized, the particular parameters chosen for the laser design are of tremendous importance. For optical data communications systems, the objective is to increase the frequency at which the laser can be modulated. In DFB lasers, the effective modulation frequency is related to the relaxation oscillation frequency of the laser, that is the frequency at which the average small signal modulation output power of the laser is at a maximum.

Therefore, attempts to increase the modulation frequency have included attempts to increase the relaxation oscillation frequency of the laser. There are a number of known methods of achieving an increase in the relaxation oscillation frequency of semi-conductor lasers. These include changing the cavity length, changing the facet reflectivity and changing the differential gain of the active region.

At present, DFB lasers with relaxation oscillation frequencies between 2 GHz and 20 GHz have been produced. Typically, such lasers permit modulation frequencies of up to 20 GB/s, which have been achieved by underdamping the output response and using a NRZ modulation scheme, by which the effective modulation frequency can be doubled.

Unfortunately, while the modulation frequency can, in an academic sense, be made to approach the relaxation oscillation frequency by such methods, the bit error rate (BER) performance will be wholly unsuitable for commercial applications. This is due to the slow response to a change in the input biasing current due to the underdamping. Moreover, there is a practical limit to the relaxation oscillation frequency that can be achieved by such conventional methods in any event.

The received power penalty is a figure of merit for comparing different transmission schemes. The received power penalty is the amount of extra power needed for the transmission configuration under consideration to achieve the same bit error rate as a baseline transmission configuration. Negative received power penalties indicate that the transmission configuration under consideration is better than the baseline transmission configuration.

Some approaches to improving the received power penalty of the laser have involved cooling the laser, as there is an inverse relationship between temperature and relative power penalty. However, providing a cooled laser system require refrigeration units that must be provided, housed and powered, with a significant increase in cost, size, weight and design effort.

Other approaches have featured lasers having optimized active regions or composed of new materials with high characteristic temperatures.

SUMMARY OF THE INVENTION

Accordingly, it is desirable to provide an improved optical laser system in which the received power penalty is improved. Furthermore, it is advantageous to provide an improved optical laser system that can operate in an uncooled environment.

The present invention achieves these aims by overdamping the output response of the laser without compromising the relaxation oscillation frequency of the output. One way of achieving such a result is to increase the gain coupling of a DFB laser to a sufficient level so as to simultaneously increase the relaxation oscillation frequency and overdamp the output response. This results in a strong negative received power penalty even in an uncooled environment.

The high level of gain coupling is achieved by deep etching of the index grating, creating grating teeth that extend deep into the active region.

Preferably the amount of gain coupling is so chosen that the relative power penalty improvement over an uncoupled exceeds 3 dB in the chosen operating environment.

According to a broad aspect of an embodiment of the present invention, there is disclosed a directly modulated, distributed feedback laser having an output beam responsive to the application of an input biasing current, wherein the output response is overdamped without reducing the relaxation oscillation frequency of the laser output, so as to quickly respond to a change in the input biasing current.

According to another broad aspect of an embodiment of the present invention, there is disclosed a method of creating a laser comprising the steps of:

(a) growing a semiconductor substrate;
(b) depositing a first doped semiconductor layer upon the substrate;
(c) creating an active semiconductor region over the first doped layer;
(d) depositing a second doped semiconductor layer having a charge opposite to that of the first doped layer upon the active region;
(e) defining an index grating which extends along the length of the semiconductor layers;
(f) selectively etching away the second doped layer and at least a portion of the active region in accordance with the layout of the index grating to a depth sufficient to produce a gain coupling sufficient to overdamp the output response of the resulting device;
(g) infilling the etched regions with doped material consistent with the composition of the second doped layer;
(h) removing the substrate;
(i) etching the semiconductor layers to a suitable width and cleaving the semiconductor layers to a suitable length; and
(j) adjusting the reflectivity of the front and rear facets so as to permit lasing to occur when a biasing signal is applied across the junctions created by the semiconductor layers, whereby the output response of the laser is adapted to quickly respond to a change in the current level of the applied biasing signal.

BRIEF DESCRIPTION OF THE DRAWINGS

The embodiments of the present invention will now be described by reference to the following figures, in which identical reference numerals in different figures indicate identical elements and in which.

DISCLOSURE OF THE PREFERRED EMBODIMENTS

Figure 1:
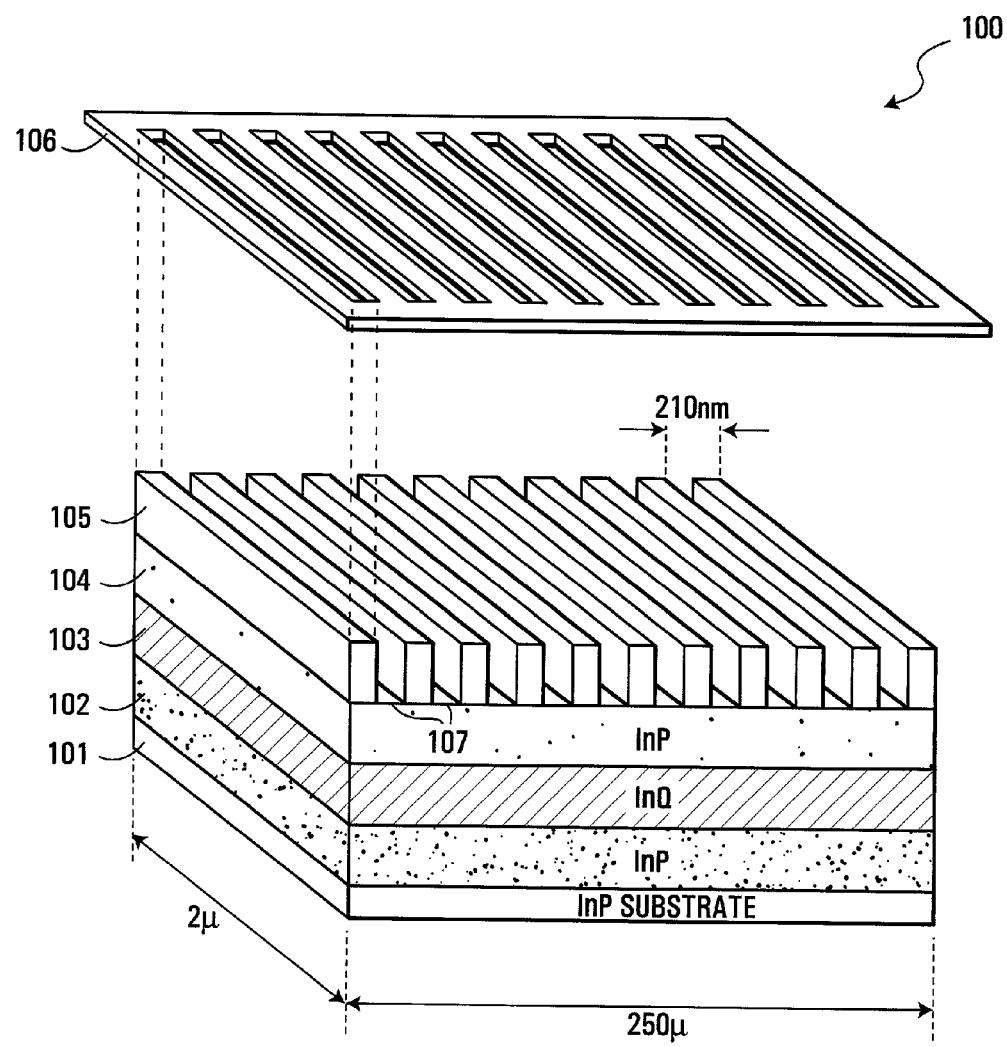
FIG. 1 is an isometric view of a device in accordance with an embodiment of the present invention mid-way through the construction stage.

Referring now to FIG. 1, there is shown, in an isometric view, a portion of wafer which is to be fashioned into a semiconductor device shown generally at 100, partially through the manufacturing process.

Those having ordinary skill in this art will recognize that a plurality of such devices will be created on the same wafer for convenience, to be separated upon completion of construction, with unused or unsuitable portions of the wafer being discarded. Nevertheless, for exemplary purposes only, only the portion of the wafer corresponding to a single finished device is shown in FIG. 1. Furthermore, while the dimensions, characteristics and parameters of the embodiment of FIG. 1 are provided, a person having ordinary skill in this art will readily recognize that other dimensions, characteristics and parameters may be equally suitable to practice the present invention and the specified data is to be considered exemplary only.

The device 100 of the embodiment of FIG. 1 has a length of 250 microns and a width of 2 microns.

The semiconductor device 100 is constructed upon a substrate 101, composed of InP. The InP substrate 101 is readily available from commercial suppliers.

A second buffer layer 102, approximately 2.5 microns in depth, of InP, but n– doped with Si, is deposited upon the InP substrate 101 in known fashion at 630° C. in a horizontal low pressure metal oxide chemical vapour deposition (MOCVD) reactor (not shown), using $H_2$ as the carrier gas, TMIn and $PH_3$ as the source reactants for In and P respectively and $SiH_4$ as the reactant for S.

The deposition techniques, compounds and reactants described herein are exemplary only. Those having ordinary skill in this art will recognize that other suitable techniques, compounds and reactants may be adapted without departing from the spirit and scope of the invention.

The material peak gain is the natural wavelength of the material and is detuned 10–20 nm to longer wavelengths from the grating wavelength, which determines the wavelength of the light emitted and, as discussed below, may be 1.3 microns. Thus, the laser is engineered not to operate at the highest gain of the material.

An active region 103 is thereafter created to a depth of 125 nm using TEGa and $AsH_3$ as source reactants for Ga and As to create, over the second buffer layer of InP 102, an InGaAsP strained active region. The active region contains the separate confinement hetero-structure.

A third buffer layer 104 of InP, 20 nm thick, doped with Zn using DEZn as the reactant, is deposited over the active region 103 in the MOCVD reactor.

Thereafter, a layer of photoresist 105 is selectively applied to the third layer 104 of InP in order to define the optical grating to be etched into the device 100. The selective application of photoresist 105 is defined by the superimposition of a mask 106 which defines areas to which photoresist will be applied.

The mask 106 has a distance of 210 nm between similar positions and is so designed as to create a Bragg wavelength of 1.3 microns (that is, a distance of 210 nm extends between two adjacent similar positions on the resulting grating), after taking into account the index of refraction of InP, which is roughly 3, along the length of the device 100.

After the application of the photoresist layer 105, the device is submitted to an etching process in which areas, such as those shown at 107, that are unprotected by the application of photoresist 105 will be etched away. The manner and depth of the etching process is a design parameter and will generally follow principles known to the person of ordinary skill in the art.

Nevertheless, in order to provide a gain-coupled DFB laser such as that which is the subject of the present invention, the etching must at least exceed the depth of the photoresist layer 105 and the immediately underlying doped InP layer 104 and extend part or all of the way into the active region layer 103.

In the present embodiment, the etching process creates a grating with a period of 210 nm between each grating tooth. The depth of the grating tooth is such as to create a gain coupling of at least 0.06 Im(kL), taking into account the other exemplary dimensions set out above.

Figure 2:
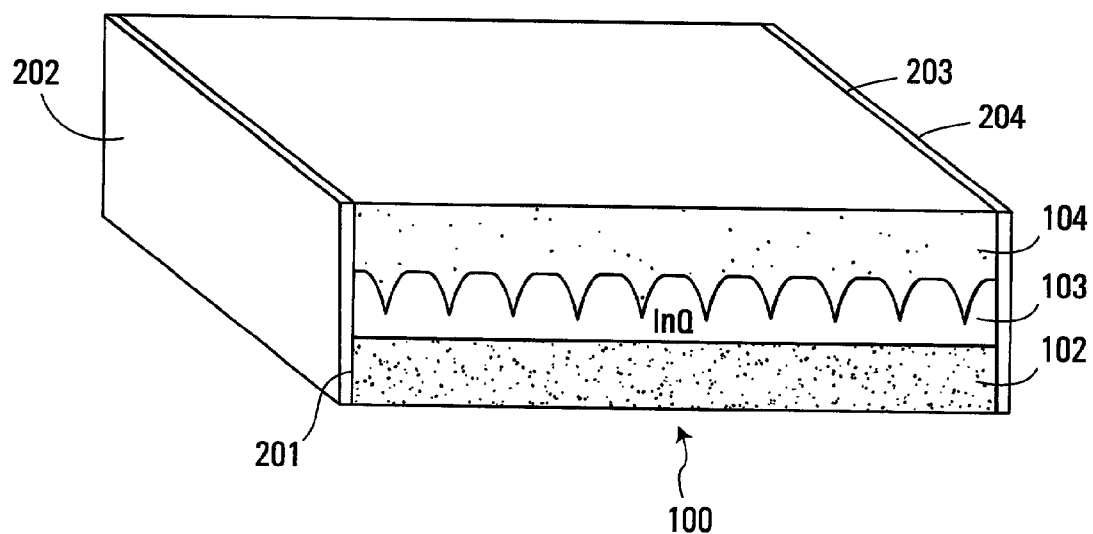
FIG. 2 is an isometric view of the device of the embodiment of FIG. 1, after completion of the construction stage.

Turning now to FIG. 2, the same exemplary device 100 is shown in finished condition. A number of steps are required to complete the device 100 as shown. The photoresist layer 105 is removed. Then, the underlying doped InP layer 104 is rebuilt, filling in the areas of both active region 103 and of the doped InP layer 104 itself, which had been etched away, with similarly doped InP.

An InP contact layer, overgrown by MOCVD has a resistance less than 8 Ω and a capacitance of less than 2 pF.

Next, the underlying InP substrate 101 is removed. At this point the wafer is fashioned into 2 micron wide ridge waveguides, cleaved to a length of 250 microns. An anti-reflection coating 202 is coated on the front facet, shown at 201 of the device 100. In the present embodiment, the coating 201 creates a front facet reflectivity of 0.05. The rear facet, shown at 203, is coated with an HR coating 204. In the present embodiment, the reflectivity of the rear facet 203 is 0.95.

The finished device 100 contains 10 InGaAsP strained MQWs in a graded index separate confinement heterostructure. It is then tested to determine whether or not it lases at the desired wavelength. Those that do not are discarded. As discussed above, the probability that the device will lase at the desired wavelength is enhanced by the gain coupling arising from the creation of the multiple QWs. Typical yields may lie in the range 73–87%.

The depth of the grating teeth occasioned by the deep etching process of the present invention has minimal impact on the yield increase generally associated with gain-coupled DFB lasers. Therefore, the etching has heretofore been minimized to the level sufficient to create a satisfactory probability of yield while at the same time to underdamp the relaxation oscillation response of the laser. In underdamping the laser output response, the 3 dB bandwidth of the output response of the laser is maximized and a higher modulation frequency can be tolerated.

The present invention eschews the prevailing thinking toward DFB laser designs that underdamp the relaxation oscillation response of the laser. Rather, lasers designed in accordance with the present invention, such as those with the exemplary parameters of the embodiment of FIG. 1 will have a significantly overdamped response.

Those of ordinary skill in this art will understand that an overdamped laser will quickly settle down in response to a modulation signal while an underdamped laser will take a number of relaxation oscillations to settle. At modulation frequencies that are significantly lower than the relaxation oscillation output frequency of the laser, an underdamped response has been acceptable. Moreover, the traditional methods, discussed above, of increasing the relaxation oscillation frequency of the laser output, such as changing the cavity length, changing the facet reflectivity and changing the differential gain of the active region, tend to simultaneously underdamp the laser output response.

However, in progressively underdamping the laser output response, the ability of the modulated output to recover from an input signal is compromised. Where the modulation frequency is much less than the relaxation oscillation frequency, this is an acceptable result and the benefits of an increased output response bandwidth can be appropriated. But when the modulation frequency begins to approach the relaxation oscillation frequency, a high degree of underdamping begins to introduce unacceptable coding errors into the output optical data stream.

At modulation frequencies that approach the relaxation oscillation output frequency of the laser, the quick response of an overdamped laser will reduce propagation errors of the resulting optical data stream.

In the embodiment of the present invention, the desired overdamped output response is obtained by increasing the gain coupling. The gain coupling is directly related to the relaxation oscillation frequency of the output as well as the damping. Thus, unlike the traditional methods of adjusting the relaxation oscillation frequency, overdamping can be achieved without the cost of a reduction in the relaxation oscillation frequency. Gain coupling in a device can be increased by increasing the depth of the grating teeth in the active region during the construction process.

Figure 3:
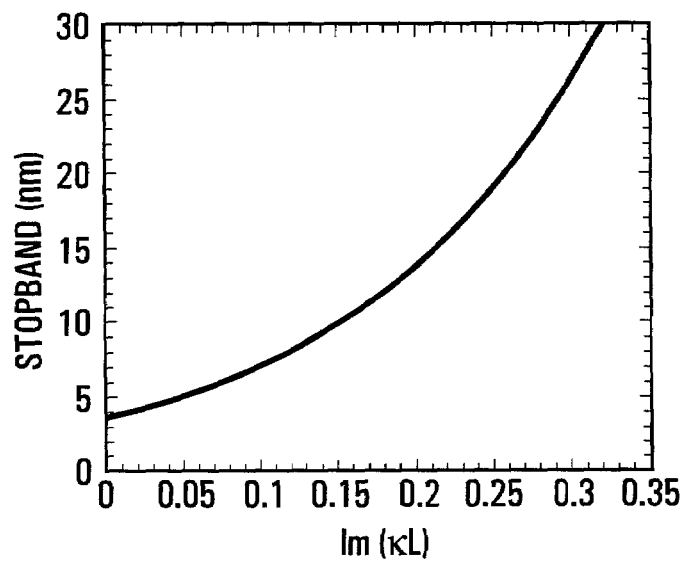
FIG. 3 is a graphical plot of the stopband of the device of the embodiment of FIG. 1, as a function of the gain-coupling level.

Turning now to FIG. 3, there is shown a plot of the stopband, calculated from the modal threshold gain, against gain coupling strength. The stopband increases with gain-coupling and stronger gain-coupling produces a larger change in stopband. This relation is used because the stopband is easier to measure directly than the gain coupling strength.

Figure 4:
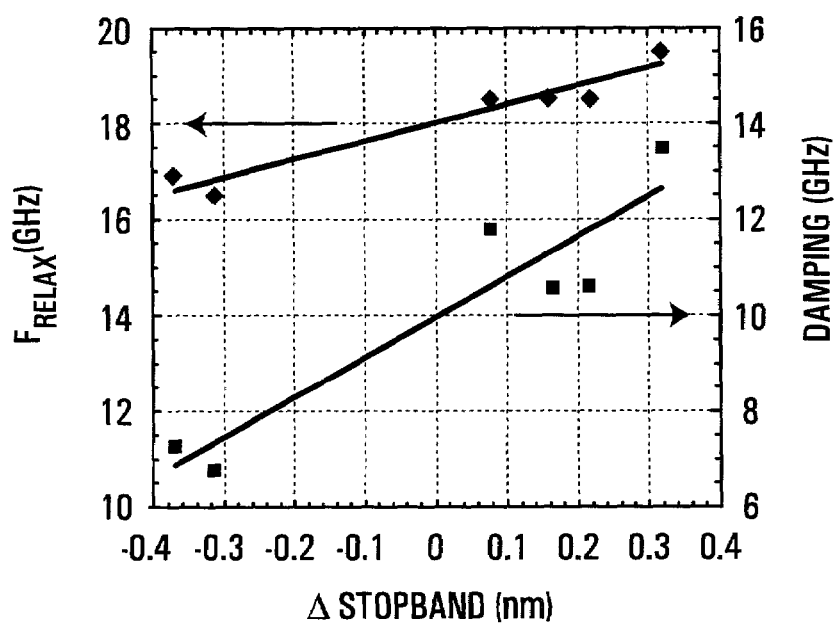
FIG. 4 is a graphical plot of the relaxation oscillation frequency and the damping as functions of the change in the stopband in respect of a device having the parameters of the embodiment of FIG. 1 but with varying degree of etching.

Turning now to FIG. 4, there is shown a plot of the relaxation oscillation frequency and damping as functions of the change in stopband.

FIG. 4 was generated by experiment. Two wafer sets were grown with the same 10 QW design. The first set had deep gratings as described above and resulted in a device 100 as shown in FIG. 2. The second set had shallower gratings. Other than the depth of the grating, devices from both sets showed similar static characteristics as shown in Table 1 below. As some of the parameters were affected by the operating temperature, values at both uncooled (90° C.) and cooled (20° C.) environments are provided.

TABLE 1

| Parameter | Cooled 20° C. | Uncooled 90° C. |
|---|---|---|
| Bragg wavelength (m) | $1.3 \times 10^{-6}$ | $1.3 \times 10^{-6}$ |
| Waveguide width (m) | $1.5 \times 10^{-6}$ | $1.5 \times 1^{-6}$ |
| QW thickness (m) | $6 \times 10^{-9}$ | $6 \times 10^{-9}$ |
| Laser cavity length (m) | $250 \times 10^{-6}$ | $250 \times 10^{-6}$ |
| Effective group index | 3.7 | 3.7 |
| Back facet reflectivity | 0.95 | 0.95 |
| Front facet reflectivity | 0.05 | 0.05 |
| Effective optical cavity loss ($m^{-1}$) | $15 \times 10^2$ | $15 \times 10^2$ |
| SRH carrier loss ($m^2$) | $2 \times 10^{-9}$ | $4 \times 10^{-9}$ |
| Bimolecular recomb. ($m^{-3}/s$) | $9 \times 10^{-17}$ | $9 \times 10^{-17}$ |
| Auger coefficient ($m^{-6}/s$) | $5 \times 10^{-41}$ | $7 \times 10^{-41}$ |
| Current injection efficiency | 0.9 | 0.9 |
| Linear gain constant ($m^2$) | $7.5 \times 10^{-20}$ | $5.5 \times 10^{-20}$ |
| Gain compression factor ($m^3$) | $9 \times 10^{-23}$ | $9 \times 10^{-23}$ |
| Carrier capture time in QW (s) | $32 \times 10^{-12}$ | $26 \times 10^{-12}$ |
| Carrier escape time in QW (s) | $100 \times 10^{-12}$ | $80 \times 10^{-12}$ |
| SCH (barrier) thickness (m) | $10 \times 10^{-9}$ | $10 \times 10^{-9}$ |
| MQW confinement factor | 0.01 | 0.01 |
| SCH confinement factor | 0.056 | 0.56 |
| Transparency carrier density ($m^{-3}$) | $1.5 \times 10^{24}$ | $2.5 \times 10^{24}$ |
| Chirp reference carrier density ($m^{-3}$) | $2 \times 10^{24}$ | $2 \times 10^{24}$ |

The relative intensity noise function (RIN) of the device 100 and its companion shallow grating device was used in order to determine the relaxation oscillation frequency $f_{relax}$ and damping $\Gamma$. The RIN was measured by known methods, using an HPT™ electrical spectrum analyzer with a 1310 optical head (comprising an HP-70810B lightwave section plugin, HP-70908A precision frequency reference module, HP-70900B local oscillator module, and HP-70004A controller in an HP-70001A mainframe) covering a range from 150 MHz to 20 GHz. Shot noise and thermal noise was extracted from the RIN by using an HP-supplied program for the HP-70004A controller. Room temperature measurements were made with 0 dBm of light coupled through a tapered fiber at 60 mA bias. This provided sufficient power to accurately measure the RIN without saturating the detector. An ILX™ LDC-3900 modular laser diode controller provided a low noise DC bias current from 20–120 mA.

The relaxation oscillation frequency $f_{relax}$ and damping $\Gamma$ were empirically determined from the RIN by fitting the measured RIN value to the following mathematical relation:

$$RIN = (A + Bf^2) / [(f^2_{relax} - f^2)^2 + (\Gamma/2\pi)^2 f^2] \quad (1)$$

FIG. 4 summarizes the relaxation oscillation frequency, damping and change in stopband for the two experimental sets of devices. Both the relaxation oscillation frequency and damping can be seen to increase with an increase in the change in stopband, which is representative of an increase in gain coupling. Further, stronger gain-coupling, as exemplified by a high change in stopband, produces both higher relaxation frequencies and stronger damping. Gain-coupling values spanning Im(kL)=0.01 to Im(kL)=0.06 best fit the two experimental sets. The observed increases result from gain-related effects including differential spatial hole burning, detuning and standing-wave effects.

Figure 5:
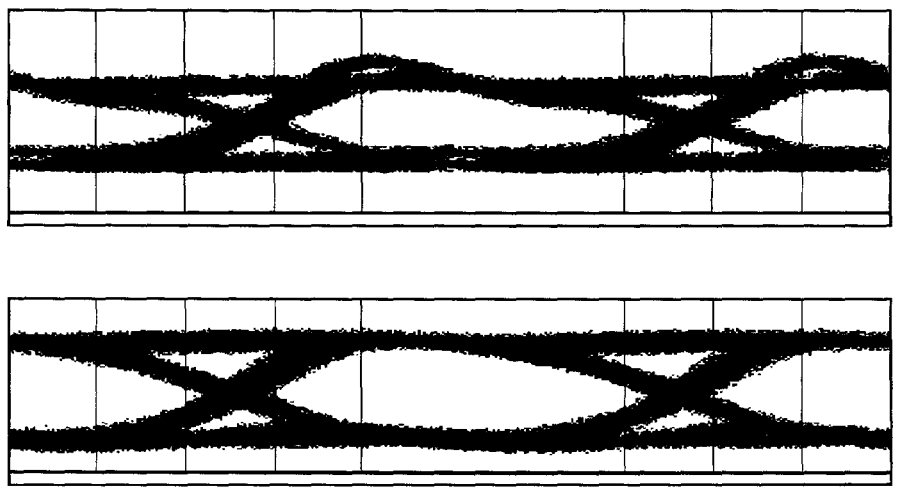
FIG. 5 is a printout of transmission eye diagrams for the device of the embodiment of FIG. 1 and for a device having the same parameters but with a shallower etching.

The improvement in the error performance is shown in FIG. 5. FIG. 5 compares a shallow grating device (top) with the deep grating device 100 described above (bottom). Both devices had an operating relaxation oscillation frequency of 16 GHz and operated at room temperature. The eyes were generated using 10 Gb/s modulation and are unfiltered. They manifest diminished overshoot and unobstructed interiors at high gain coupling. Simulated data demonstrate that even in uncooled environments (90° C.), the strongly gain-coupled eye showed superior performance to that of the weakly gain-coupled eye.

Figure 6:
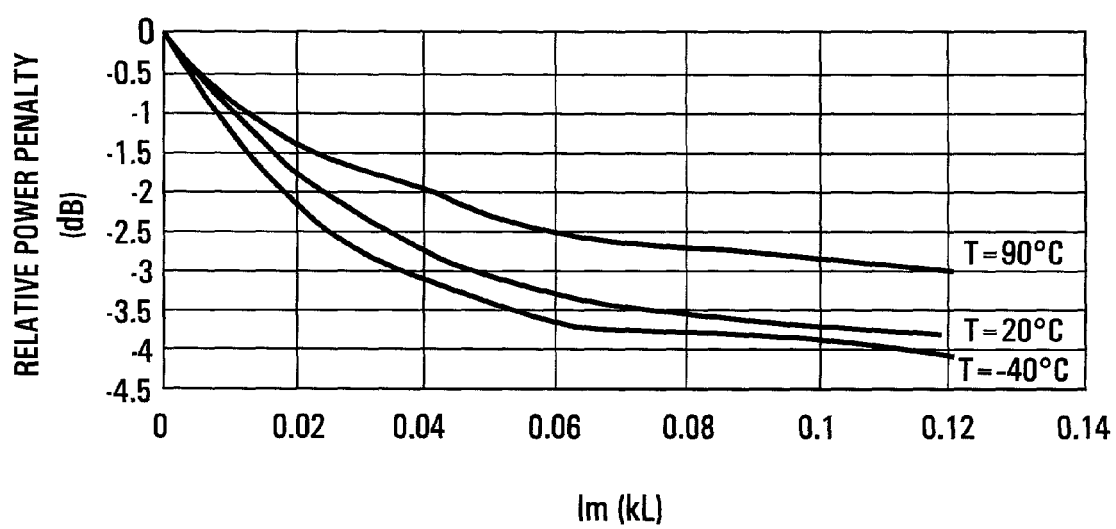
FIG. 6 is a graphical plot of the relative power penalty for the device of the embodiment of FIG. 1 in various simulated operating environments as a function of the gain-coupling level.

Turning now to FIG. 6, there is shown a plot of the relative power penalty for a simulated short-reach link transmission against the level of gain-coupling. The relative link transmission was assessed using a transmission-line laser model (TLLM) coupled into a link simulation package in a 20 km single mode fiber (SMF) simulation. A dispersion of 340 ps/nm was assumed. The relative received power penalty using gain coupling improved 3 db over pure index-coupling at 90° C. A received BER of $10^{-9}$ was detected at the receiver. Above a certain level of gain coupling (in FIG. 6, approximately Im(kL)=0.06, the relative received power penalty improvement saturated yielding only incremental improvement for larger gain-coupling strength.

Therefore, a threshold may be set at the minimum gain-coupling necessary to obtain the benefit of the present invention. As a rough approximation, the minimum gain-coupling may be chosen to be that which provides a relative power penalty improvement of 3 dB from no gain coupling for a particular operating environment.

It will be apparent to those skilled in this art that various modifications and variations may be made to the embodiments disclosed herein, consistent with the present invention, without departing from the spirit and scope of the present invention.

Other embodiments consistent with the present invention will become apparent from consideration of the specification and the practice of the invention disclosed therein.

Accordingly, the specification and the embodiments are to be considered exemplary only, with a true scope and spirit of the invention being disclosed by the following claims.

What is claimed is:

1. A directly modulated, distributed feedback gain-coupled laser having an output beam responsive to the application of an input biasing current, comprising an active region to which a grating is applied such that gain-coupling defined by Im(kL) is at least 0.06.

2. A laser according to claim 1 in which the gain coupling is sufficient to provide, in an environment in which the laser is to operate, a significant reduction in the received power penalty from a laser having less gain coupling.

3. A laser according to claim 2, in which the level of gain coupling exceeds a threshold level, whereby, in the environment in which the laser is to operate, there is a significant reduction in received power penalty from a laser with gain-coupling less than the threshold level, but no significant further reduction in received power penalty will be obtained from a laser with gain-coupling greater than the threshold level.

4. A laser according to claim 2 in which, in the environment in which the laser is to operate, the level of gain coupling is sufficient to provide a 3 dB reduction in the received power penalty from a laser having no gain coupling.

5. A laser according to claim 1 in which the input biasing current is modulated at a frequency which approaches the relaxation oscillation frequency of the laser output.

6. A laser according to claim 2 in which the environment is uncooled.

* * * * *